(12) United States Patent
Yang

(10) Patent No.: US 7,566,516 B2
(45) Date of Patent: Jul. 28, 2009

(54) PHOTOMASK AND METHOD OF MANUFACTURING THE SAME

(75) Inventor: Chin-Cheng Yang, Hsinchu (TW)

(73) Assignee: MACRONIX International Co., Ltd., Hsinchu (TW)

( * ) Notice: Subject to any disclaimer, the term of this patent is extended or adjusted under 35 U.S.C. 154(b) by 819 days.

(21) Appl. No.: 11/150,067

(22) Filed: Jun. 9, 2005

(65) Prior Publication Data

US 2006/0281019 A1    Dec. 14, 2006

(51) Int. Cl.
*G03F 1/00* (2006.01)
(52) U.S. Cl. ............................................. 430/5; 430/22
(58) Field of Classification Search ................. 430/5, 430/22, 394; 716/19, 20, 21
See application file for complete search history.

(56) References Cited

U.S. PATENT DOCUMENTS

| | | | |
|---|---|---|---|
| 5,786,260 A | 7/1998 | Jang et al. | 438/401 |
| 6,043,133 A | 3/2000 | Jang et al. | 438/401 |
| 6,049,137 A | 4/2000 | Jang et al. | 357/797 |
| 6,624,039 B1 | 9/2003 | Abdelgadir et al. | 438/401 |
| 6,838,217 B1 * | 1/2005 | Chen et al. | 430/22 |

* cited by examiner

*Primary Examiner*—Stephen Rosasco
(74) *Attorney, Agent, or Firm*—J.C. Patents

(57) ABSTRACT

A photomask for defining a photoresist layer formed on a wafer having at least an alignment mark region, wherein each alignment mark region has an alignment mark. The photomask comprises a shot region and an alignment mark pattern region. The alignment mark pattern region has a profile equal to the profile of the alignment mark region on the wafer. Further, the alignment mark pattern region comprises a block region, a clean-out region and a dummy pattern region. The position of the block region in the alignment mark pattern region corresponds to the relative position of the alignment mark in the alignment mark region. The clean-out region is adjacent to one side of the block region and the dummy pattern region is adjacent to another side of the block region.

32 Claims, 4 Drawing Sheets

PHOTOMASK AND METHOD OF MANUFACTURING THE SAME

BACKGROUND OF THE INVENTION

1. Field of Invention

The present invention relates to photomask and the method of manufacturing photomask. More particularly, the present invention relates to a photomask and the method of manufacturing the photomask with an alignment mark region layout.

2. Description of Related Art

In the manufacture of integrated circuit, photolithography process is used to transfer patterns from a photo mask having customized circuit patterns to thin films formed on a wafer. The image transfer process comprises steps of forming a photoresist layer on a non-process layer, illuminating the photoresist layer through a photo mask having the customized circuit patterns, developing the photoresist layer and then etching the non-process layer by using the patterned photoresist layer as a mask. Hence, the image transfer process is accomplished. For a well-manufactured integrated circuit product, the image transfer process mentioned above is performed several times to transfer the circuit patterns to each non-process layers to form the electrical circuit device. Therefore, it is important to align the successive patterned layers to reduce the misalignment errors as the critical dimension of the semiconductor device becomes smaller and smaller.

To achieve proper alignment, at least two alignment marks are formed at the area around the wafer peripheral region. Typically, the alignment marks are located on opposite sides of the wafer diameter and the alignment marks include a series of parallel trenches covering a rectangular or square area. During each subsequent level of manufacturing a multi-level semiconductor device, it is undesired to overwrite the alignment mark so that a portion of the photoresist layer over the alignment marks is covered by mask blades during exposure process. However, the shadow effect happens to transform a portion of the photoresist layer covered by the mask blades near the edge of the mask blades into a shadow region. That is, the portion of the photoresist layer covered by the mask blades near the edge of the mask blades is underexposed due to diffraction. Therefore, after a develop process, the partial underexposed portion of the photoresist layer is removed by the developer and leaves the photoresist residual around the alignment marks. Hence, the photoresist residual will produce undesired residual and defects after photo or etching process.

Accordingly, in the conventional photolithography process, after the stepper performs an exposure process on a shot region next to the alignment mark, it is necessary to perform several exposure processes to further clean out the shadow region around the alignment mark in order to remove the possible photoresist residual in the later develop process. Therefore, the time for transferring the pattern from the photomask to the layer formed over the wafer is increased. Hence, the throughput is decreased.

SUMMARY OF THE INVENTION

Accordingly, at least one objective of the present invention is to provide a method of designing a photomask, wherein the photomask comprises a shot region and an alignment mark pattern region. By using the alignment mark pattern region for defining a portion of the photoresist layer over the alignment mark, only one exposure process can not only clean out the photoresist residual due to the shadow effect and pattern a portion of the alignment mark region of the wafer to form the dummy patterns at the same time but also simultaneously protect the alignment mark on the wafer from being patterned or damaged during the exposure process.

Moreover, another objective of the present invention is to provide a photomask possessing a shot region and an alignment mark pattern region. Since the alignment mark region comprises a clean-out region, a block region and a dummy pattern region, only one exposure process can not only clean out the photoresist residual around the alignment mark on the wafer due to the shadow effect and pattern a portion of the alignment mark region of the wafer to form the dummy patterns at the same time but also simultaneously protect the alignment mark on the wafer from being patterned or damaged during the exposure process.

Furthermore, the other objective of the present invention is to provide a method for defining a portion of the photoresist layer over an alignment mark region of a wafer with the usage of a photomask having a shot region and an alignment mark pattern region. By using the alignment mark pattern region for defining a portion of the photoresist layer over the alignment mark, only one exposure process can not only clean out the photoresist residual due to the shadow effect and pattern a portion of the alignment mark region of the wafer to form the dummy patterns at the same time but also simultaneously protect the alignment mark on the wafer from being patterned or damaged during the exposure process.

The present invention provides a method of designing a photomask for defining a photoresist layer formed on a wafer, wherein the wafer has at least two alignment marks formed thereon. The method comprises steps of providing a shot size and then creating an optimal shot map, wherein the optimal shot map is composed of a plurality of shots and the optimal shot map matches with a profile of the wafer to have maximum number of complete shots inside the profile. An optimal relative position of an alignment mark region on the wafer with respect to the optimal shot map and a relative position of the alignment mark in the alignment mark region are obtained. A layout of a photomask is designed to have a shot region and at least an alignment mark pattern region having a profile equal to the profile of the alignment mark region on the wafer, wherein a first ratio of the size of the shot region to the shot size is equal to a second ratio of the size of the alignment mark pattern region to the size of the alignment mark region and the alignment mark pattern region comprises a block region, a clean-out region and a dummy pattern region. The position of the block region in the alignment mark pattern region corresponds to the relative position of the alignment mark in the alignment mark region. The clean-out region is adjacent to one side of the block region and the dummy pattern region is adjacent to another side of the block region.

The present invention provides a photomask for defining a photoresist layer formed on a wafer having at least an alignment mark region, wherein each alignment mark region has an alignment mark formed therein. The photomask comprises a shot region and at least one alignment mark pattern region. The alignment mark pattern region has a profile equal to the profile of the alignment mark region on the wafer, wherein the size of the alignment mark pattern region is proportional to the size of the alignment mark region with a first scaling factor. Further, the alignment mark pattern region comprises a block region, a clean-out region and a dummy pattern region. The position of the block region in the alignment mark pattern region corresponds to the relative position of the alignment mark in the alignment mark region. The clean-out region is adjacent to one side of the block region and the dummy pattern region is adjacent to another side of the block region.

A method for defining a portion of a photoresist layer over an alignment mark region of a wafer, wherein the alignment mark region has an alignment mark formed therein. The method comprises a step of defining the portion of the photoresist layer over the alignment mark region of the wafer by using an alignment mark pattern region on a photomask as a mask. The alignment mark pattern region has a profile equal to the profile of the alignment mark region on the wafer and the size of the alignment mark pattern region is proportional to the size of the alignment mark region with a first scaling factor. The alignment mark pattern region comprises a block region, a clean-out region and a dummy pattern region. The position of the block region in the alignment mark pattern region corresponds to a relative position of the alignment mark in the alignment mark region on the wafer. The clean-out region is adjacent to one side of the block region and the dummy pattern region is adjacent to another side of the block region.

In the present invention, the width of the clean-out region is proportional to that of the shadow effect with a second scaling factor equal to the first scaling factor. More preferably, the width of the clean-out region is no less than 300 μm. Also, the clean-out region is one hundred percent transparent. Further, a pattern density of the dummy pattern region is similar to that of the shot region. Moreover, the block region is opaque when the photomask is used in a formation process of shallow trench isolation. On the other hand, the block region is one hundred percent transparent when the photomask is used as a reverse diffusion layer mask cooperating with an etching back process. Furthermore, wherein the width of the block region is of about 1600 μm. In addition, the first scaling factor can be 1.

Since the alignment mark pattern region of the photomask comprises not only the block region but also the clean-out region and the dummy pattern region, only one exposure process can not only clean out the photoresist residual due to the shadow effect and pattern a portion of the alignment mark region of the wafer to form the dummy patterns at the same time but also simultaneously protect the alignment mark on the wafer from being patterned or damaged during the exposure process. Therefore, the time and the steps for defining the patterns on the alignment mark region on the wafer can be saved. Hence, the throughput can be increased. Further, because of the dummy pattern region around the block region in the alignment mark pattern region on the photomask, the dummy patterns will be formed around the alignment mark on the wafer and the pattern density and step height around the alignment mark is more similar to those of the die in the main die region.

It is to be understood that both the foregoing general description and the following detailed description are exemplary, and are intended to provide further explanation of the invention as claimed.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DESCRIPTION OF THE PREFERRED EMBODIMENTS

The accompanying drawings are included to provide a further understanding of the invention, and are incorporated in and constitute a part of this specification. The drawings illustrate embodiments of the invention and, together with the description, serve to explain the principles of the invention.

Figure 1:
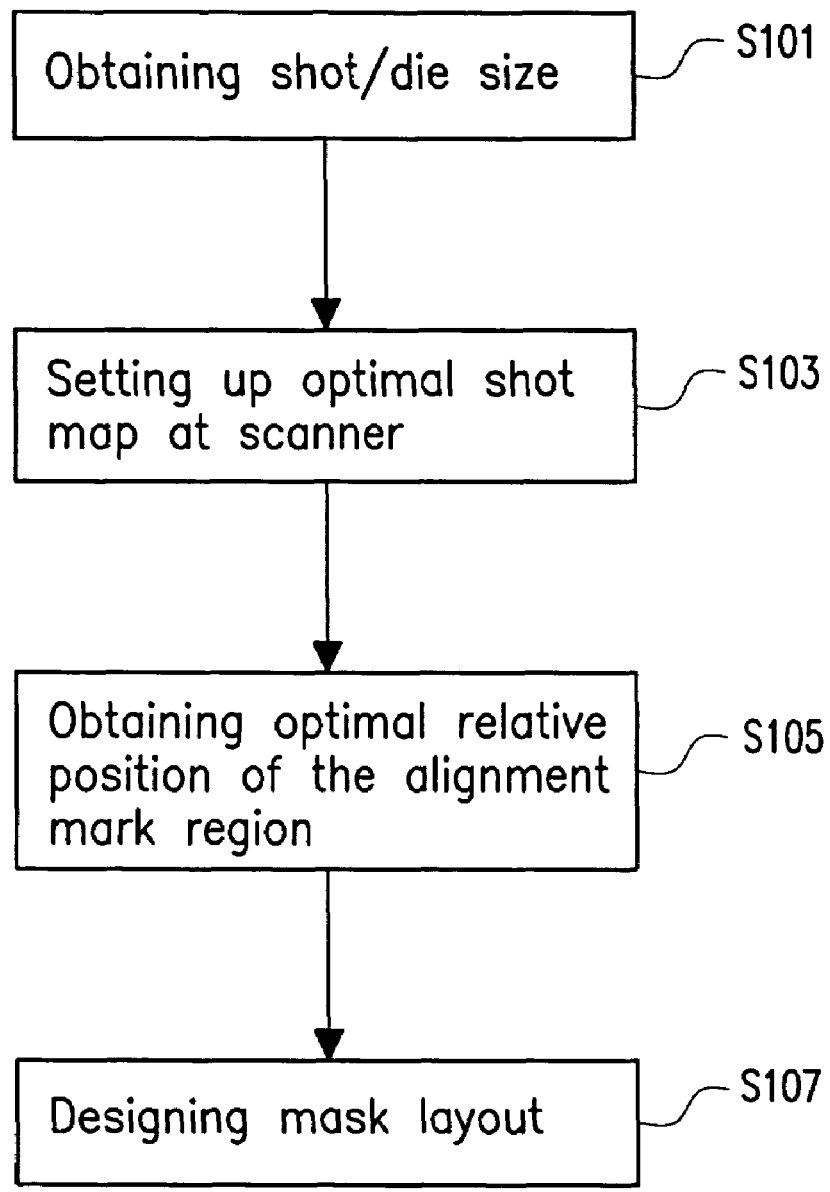
FIG. 1 is a flow chart schematically illustrating a method of manufacturing a photomask according to one of the preferred embodiment of the present invention.

FIG. 1 is a flow chart schematically illustrating a method of manufacturing a photomask according to one of the preferred embodiment of the present invention. As shown in FIG. 1, in the step S101, a desired shot size is obtained. Specially, the shot size can be, for example, equal to the default shot size of the stepper used in the exposure process or can be, for example, a customized shot size with respect to the die size of different product.

Figure 2A:
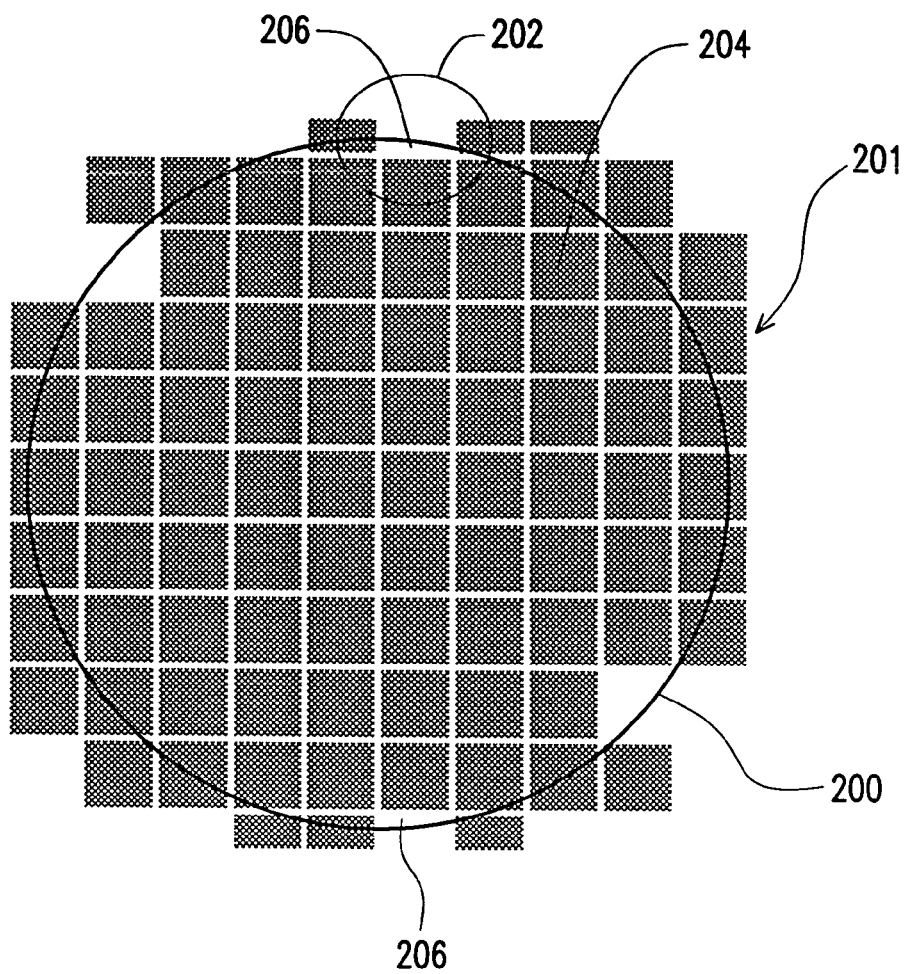
FIG. 2A is a schematic top view of the optimal shot map over a wafer.

FIG. 2A is a schematic top view of the optimal shot map over a wafer. Referring to FIG. 1 together with FIG. 2A, in the step S103, after the size of each shot is determined, the optimal shot map 201 (shown in FIG. 2A) is created to ensure that the area of a single wafer 200 can accommodate the maximum number of the complete shots 204. Therefore, the die is compactly formed on the wafer 200 without wasting any space. Notably, for each wafer 200, there are at least two alignment marks positioned opposite to each other around the rim of the wafer 200. Since it is not desired to form the pattern over the alignment marks, the shot map does not encompass the alignment marks and leaves a blank region 206 on the wafer 200.

Figure 2B:
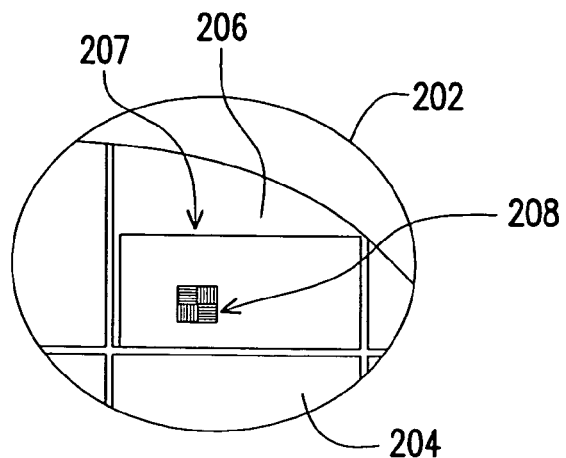
FIG. 2B is an enlarged drawing of a rim region of the wafer shown in FIG. 2A.

FIG. 2B is an enlarged drawing of a rim region 202 of the wafer shown in FIG. 2A. Referring to FIG. 1 together with FIGS. 2A and 2B, in the step S105, after the optimal shot map 201 is obtained, a relative position of the alignment mark region 207 (shown in FIG. 2B) encompassing the alignment mark 208 on the wafer 200 is located based on the shot size. Meanwhile, the size of the alignment mark region 207 and the relative position of the alignment mark 208 in the alignment mark region 207 are also determined according to the shot size and the well designed shot map 201 on the wafer 200.

Figure 3A:
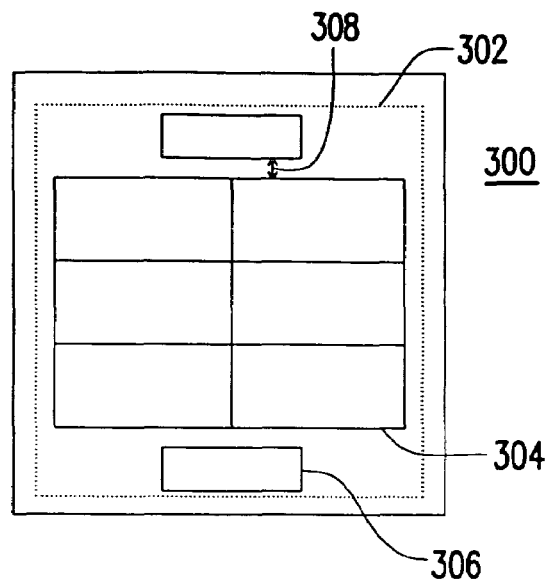
FIG. 3A is a schematic layout of a photomask according to the preferred embodiment of the present invention.

Referring to FIG. 1, in the step S107, since the shot size and the size of the alignment mark region 207 are obtained from previous steps, the layout of a photomask can be designed. FIG. 3A is a schematic layout of a photomask according to the preferred embodiment of the present invention. As shown in FIG. 3A, for each mask 300, there is a maximum exposure area 302. Usually, the layout of a shot region 304 with the profile equal to that of the shot 204 (shown in FIG. 2A) is located inside the maximum exposure area 302. Further, the size of the shot region 304 is proportional to that of the shot size. That is, the ratio of the size of the shot region 304 to the shot size is equal to the scaling factor of the stepper used in exposure process. It should be noticed that the shot region 304 is composed of several well-arranged identical die layouts. Similarly, the size of the die layout is proportional to that of a die (not shown) on the wafer 200 (shown in FIG. 2A) with a scaling factor equal to that of the stepper. As shown in FIG. 3A, the shot 304 is composed of six die layouts. However, the shot 304 is not limited to be composed of six die layouts. The number of the identical die layout for composing the shot can be varied with the die size and the product type. Notably, the scaling factor can be any real number. That is, in the previous and forgoing description, the proportional factor or the ration of the elements on photomask to the corresponding elements on the wafer can be any real number, such as 1.

In addition, besides the shot region 304, at least one alignment mark pattern region 306 is located aside the shot region 304 inside the maximum exposure area 302, wherein the profile of the alignment mark pattern region 306 is equal to that of the alignment mark region 207 on the wafer 200 (shown in FIG. 2A) and the size of the alignment mark pattern region 306 is proportional to that of the alignment mark region 207 on the wafer 200 with a scaling factor equal to that of the stepper. That is, the ratio of the size of the alignment mark pattern region 306 to that of the alignment mark region 207 is equal to the ratio of the size of the shot region 304 to the shot size. Notably, the alignment mark pattern region 306 is apart from the shot region 304 for a distance 308 proportional to the shadow effect distance happening on the wafer 200 with a scaling factor equal to that of the stepper. More preferably, the distance 308 between the shot region 304 and the alignment mark pattern region 306 is not less than 300 μm.

Figure 3B:
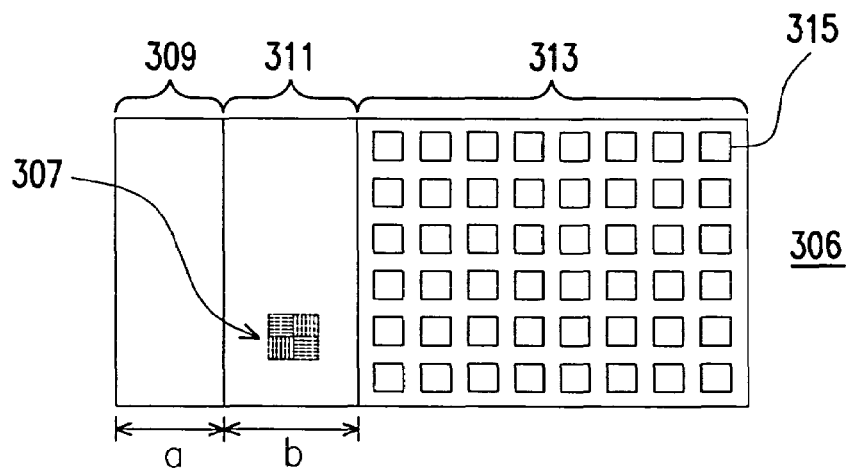
FIG. 3B is a schematic layout of an alignment mark pattern region on the photomask shown in FIG. 3A.
Figure 3C:
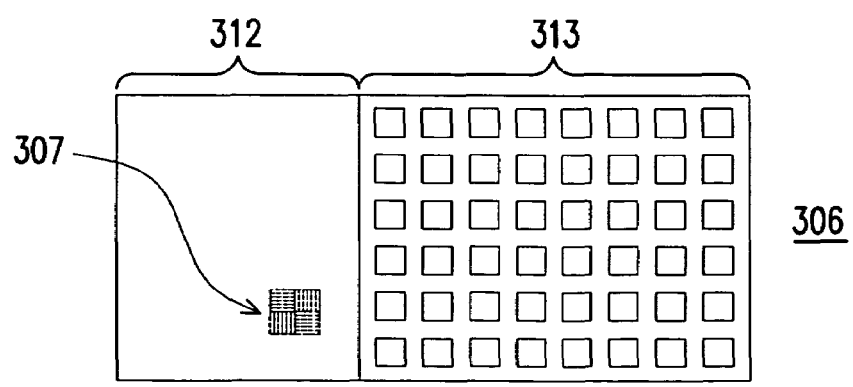
FIG. 3C is a schematic layout of another alignment mark pattern region on the photomask shown in FIG. 3A.

FIG. 3B is a schematic layout of an alignment mark pattern region on the photomask shown in FIG. 3A. Moreover, FIG. 3C is a schematic layout of another alignment mark region on the photomask shown in FIG. 3A. As shown in FIG. 3A, the alignment mark pattern region 306 is divided into three regions, a clean-out region 309, a block region 311 and a dummy pattern region 313. While the photoresist layer (not shown) used to transfer the patterns from the shot region 304 to the layer on the wafer is a positive photoresist layer, the clean-out region 309 is a hundred percent transparent region without having any pattern formed thereon. Therefore, during the later exposure process for defining the patterns of the photoresist layer over the alignment mark region 207 (shown in FIG. 2B), the unexposed portion of the photoresist layer near the alignment mark due to the shadow effect can be fully exposed by being covered by this clean-out region 309. It should be noticed that the width a of the clean-out region 309 is proportional to the shadow effect happening on the wafer 200 with a scaling factor equal to that of the stepper. More preferably, the width a is no more than 500 μm.

Furthermore, the block region 311 is used to block the alignment mark 208 (shown in FIG. 2B) from being patterned during exposure process. In FIG. 3B, the dotted alignment mark 307 is used to indicate the corresponding position of the alignment mark 208 on the wafer 200. Since the relative position of the alignment mark 208 in the alignment mark region 207 is known from the previous steps, range of the block region 311 of the alignment mark pattern region 306 on the photomask 300 can be determined. In the application, there is no pattern in the block region 311. Notably, the block region 311 can be, for example, either one hundred percent transparent or opaque depending on different requirements of the process. For example, in the formation process of shallow trench isolation, when the photomask 300 is used to transfer the pattern of the shallow trench isolations onto the photoresist layer over the wafer, the block region 311 on the photomask 300 is opaque to protect the alignment mark 208 on the wafer from being patterned or damaged during the formation process of shallow trench isolation. On the other hand, in the formation process of shallow trench isolation, when the photomask is used as a reverse diffusion layer mask cooperating with an etching back process for achieving the uniformity of later chemical mechanical polishing (CMP) process, the block region 311 on the photomask 300 is one hundred percent transparent region 312 (shown in FIG. 3C). In addition, for an 800-by-800-μm alignment mark, the width b of the block region 311 is of about 1600 μm so that the block region 311 is large enough to cover the alignment mark 208 on the wafer.

Moreover, referring to FIG. 3B together with FIG. 3C, in the dummy pattern region 313, there are dummy patterns 315 with a pattern density similar to that of the patterns in each die in the shot region 304 (shown in FIG. 3A). In both FIGS. 3B and 3C, the dummy patterns 315 is represented by several squares. However, it is not limited to form the dummy pattern 315 in square profile. In application, the dummy pattern can be strip type as long as the pattern density is similar to that of the die in the shot region 302.

Figure 4:
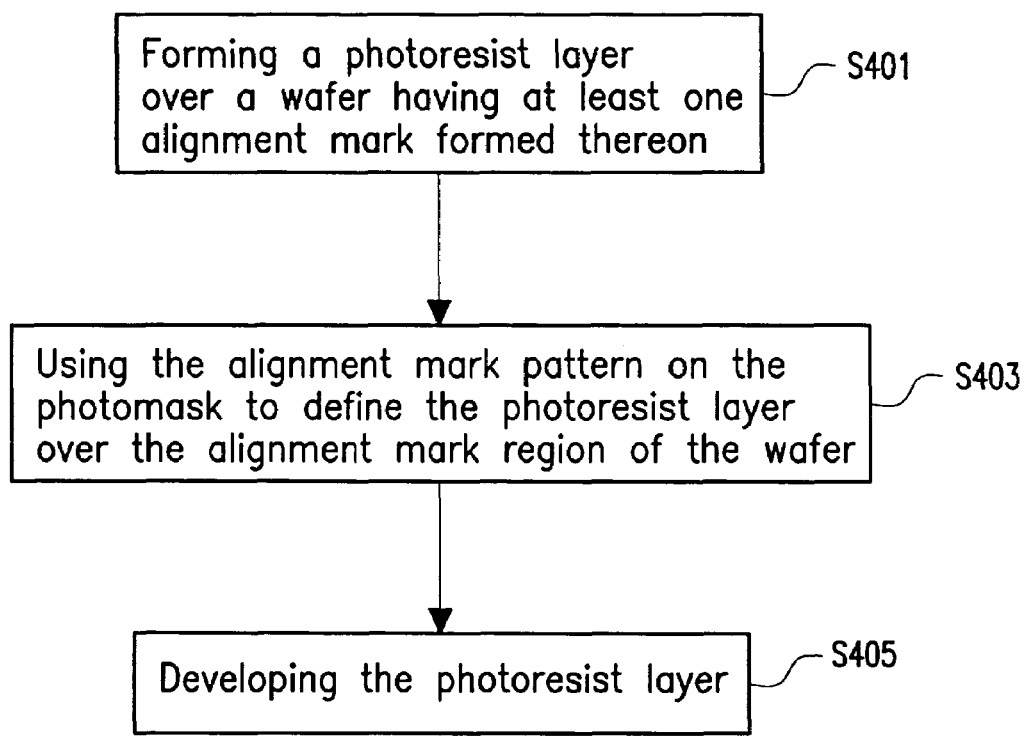
FIG. 4 is a flow chart schematically illustrating a method of patterning a photoresist layer over an alignment mark on a wafer by using a photomask according to one of the preferred embodiment of the present invention.

FIG. 4 is a flow chart schematically illustrating a method of patterning a photoresist layer over an alignment mark on a wafer by using a photomask according to one of the preferred embodiment of the present invention. As shown in FIG. 4, in the step S401, a photoresist layer (not shown) is formed over a wafer having at least one alignment mark formed thereon, wherein the wafer comprises an alignment mark region and a main die region (not shown), and the alignment mark is located inside an alignment mark region. In the step S403, an exposure process is performed to define a portion of the photoresist layer over the alignment mark region by using an alignment mark pattern region of a photomask, wherein the alignment mark pattern region comprises a clean-out region 309, a block region 311 and a dummy pattern region 313. In the step S405, a developing process is performed to finishing the alignment mark region patterning process.

Since the alignment mark pattern region of the photomask comprises not only the block region but also the clean-out region and the dummy pattern region, only one exposure process can not only clean out the photoresist residual due to the shadow effect and pattern a portion of the alignment mark region of the wafer to form the dummy patterns at the same time but also simultaneously protect the alignment mark on the wafer from being patterned or damaged during the exposure process. Therefore, the time and the steps for defining the patterns on the alignment mark region on the wafer can be saved. Hence, the throughput can be increased. Further, because of the dummy pattern region around the block region in the alignment mark pattern region on the photomask, the dummy patterns will be formed around the alignment mark on the wafer and the pattern density and step height around the alignment mark is more similar to those of the die in the main die region.

It will be apparent to those skilled in the art that various modifications and variations can be made to the structure of the present invention without departing from the scope or spirit of the invention. In view of the foregoing descriptions, it is intended that the present invention covers modifications and variations of this invention if they fall within the scope of the following claims and their equivalents.

What is claimed is:
1. A method of designing a photomask for defining a photoresist layer formed on a wafer, wherein the wafer has at least two alignment marks formed thereon, the method comprising:

providing a shot size;

creating an optimal shot map, wherein the optimal shot map is composed of a plurality of shots and the optimal shot map matches with a profile of the wafer to have maximum number of complete shots inside the profile;

obtaining an optimal relative position of an alignment mark region on the wafer with respect to the optimal shot map and a relative position of the alignment mark in the alignment mark region; and designing a layout of a photomask to have a shot region and at least an alignment mark pattern region having a profile equal to the profile of the alignment mark region on the wafer, wherein a first ratio of the size of the shot region to the shot size is equal to a second ratio of the size of the alignment mark pattern region to the size of the alignment mark region and the alignment mark pattern region comprises:

a block region with a position in the alignment mark pattern region corresponding to the relative position of the alignment mark in the alignment mark region;

a clean-out region adjacent to one side of the block region; and a dummy pattern region adjacent to another side of the block region.

2. The method of claim 1, wherein the width of the clean-out region is proportional to that of the shadow effect with a scaling factor equal to the first ratio.

3. The method of claim 1, wherein the width of the clean-out region is no less than 300 µm.

4. The method of claim 1, wherein the clean-out region is one hundred percent transparent.

5. The method of claim 1, wherein a pattern density of the dummy pattern region is similar to that of the shot region.

6. The method of claim 1, wherein the block region is opaque.

7. The method of claim 6, wherein the photomask is used in a formation process of shallow trench isolation.

8. The method of claim 1, wherein the block region is one hundred percent transparent.

9. The method of claim 8, wherein the photomask is used as a reverse diffusion layer mask cooperating with an etching back process.

10. The method of claim 1, wherein the width of the block region is of about 1600 µm.

11. A photomask for defining a photoresist layer formed on a wafer having at least an alignment mark region, wherein each alignment mark region has an alignment mark formed therein, the photomask comprising:

a shot region; and at least an alignment mark pattern region having a profile equal to the profile of the alignment mark region on the wafer, wherein the size of the alignment mark pattern region is proportional to the size of the alignment mark region with a first scaling factor and the alignment mark pattern region comprises:

a block region with a position in the alignment mark pattern region corresponding to a relative position of the alignment mark in the alignment mark region on the wafer;

a clean-out region adjacent to one side of the block region; and a dummy pattern region adjacent to another side of the block region.

12. The photomask of claim 11, wherein the width of the clean-out region is proportional to that of the shadow effect with a second scaling factor equal to the first scaling factor.

13. The photomask of claim 11, wherein the width of the clean-out region is no less than 300 µm.

14. The photomask of claim 11, wherein the clean-out region is one hundred percent transparent.

15. The photomask of claim 11, wherein a pattern density of the dummy pattern region is similar to that of the shot region.

16. The photomask of claim 11, wherein the block region is opaque.

17. The photomask of claim 16, wherein the photomask is used in a formation process of shallow trench isolation.

18. The photomask of claim 11, wherein the block region is one hundred percent transparent.

19. The photomask of claim 18, wherein the photomask is used as a reverse diffusion layer mask cooperating with an etching back process.

20. The photomask of claim 11, wherein the width of the block region is of about 1600 µm.

21. The photomask of claim 11, wherein the first scaling factor can be 1.

22. A method for defining a portion of a photoresist layer over an alignment mark region of a wafer, wherein the alignment mark region has an alignment mark formed therein, the method comprising:

defining the portion of the photoresist layer over the alignment mark region of the wafer by using an alignment mark pattern region on a photomask as a mask, wherein the alignment mark pattern region has a profile equal to the profile of the alignment mark region on the wafer and the size of the alignment mark pattern region is proportional to the size of the alignment mark region with a first scaling factor and the alignment mark pattern region comprises:

a block region with a position in the alignment mark pattern region corresponding to a relative position of the alignment mark in the alignment mark region on the wafer;

a clean-out region adjacent to one side of the block region; and a dummy pattern region adjacent to another side of the block region.

23. The method of claim 22, wherein the width of the clean-out region is proportional to that of the shadow effect with a second scaling factor equal to the first scaling factor.

24. The method of claim 22, wherein the width of the clean-out region is no more than 500 µm.

25. The method of claim 22, wherein the clean-out region is one hundred percent transparent.

26. The method of claim 22, wherein a pattern density of the dummy pattern region is similar to that of the shot region.

27. The method of claim 22, wherein the block region is opaque.

28. The method of claim 27, wherein the photomask is used in a formation process of shallow trench isolation.

29. The method of claim 22, wherein the block region is one hundred percent transparent.

30. The method of claim 29, wherein the photomask is used as a reverse diffusion layer mask cooperating with an etching back process.

31. The method of claim 22, wherein the width of the block region is of about 1600 µm.

32. The method of claim 22, wherein the first scaling factor can be 1.

* * * * *